(12) United States Patent
Kishimoto (10) Patent No.: US 6,832,328 B2
(45) Date of Patent: Dec. 14, 2004

(54) PLACEMENT AND ROUTING METHOD FOR OPTIMIZING CLOCK SKEW IN CLOCK DISTRIBUTION CIRCUIT

(75) Inventor: Satoru Kishimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 659 days.

(21) Appl. No.: 09/850,228

(22) Filed: May 8, 2001

(65) Prior Publication Data

US 2002/0013913 A1 Jan. 31, 2002

(30) Foreign Application Priority Data

Jul. 28, 2000 (JP) ........................................ 2000-228418

(51) Int. Cl.$^7$ ................................................ G06F 1/04
(52) U.S. Cl. ........................ 713/503; 713/400; 713/500; 713/503; 716/9; 716/10; 716/12
(58) Field of Search .............................. 713/400, 500, 713/503; 716/9, 10, 12

(56) References Cited

U.S. PATENT DOCUMENTS

| | | | | |
|---|---|---|---|---|
| 5,564,022 A | * | 10/1996 | Debnath et al. | ............ 713/503 |
| 5,686,845 A | * | 11/1997 | Erdal et al. | .................... 326/93 |
| 5,880,607 A | * | 3/1999 | Mitra | .......................... 326/93 |
| 5,917,729 A | * | 6/1999 | Naganuma et al. | ........... 716/10 |
| 6,157,237 A | * | 12/2000 | Mitra | ......................... 327/295 |
| 6,246,277 B1 | * | 6/2001 | Nitta et al. | .................. 327/292 |
| 6,313,683 B1 | * | 11/2001 | Block et al. | ................. 327/295 |
| 6,367,060 B1 | * | 4/2002 | Cheng et al. | .................. 716/10 |
| 6,448,168 B1 | * | 9/2002 | Rao et al. | .................... 438/598 |
| 6,543,038 B1 | * | 4/2003 | Tetelbaum | ...................... 716/6 |
| 6,701,289 B1 | * | 3/2004 | Garnett et al. | ................. 703/14 |
| 6,704,916 B1 | * | 3/2004 | Nishida et al. | ............... 716/10 |
| 2001/0054171 A1 | * | 12/2001 | Furumoto et al. | ............. 716/6 |

FOREIGN PATENT DOCUMENTS

| | | | | |
|---|---|---|---|---|
| EP | 0 684 572 A2 | * | 11/1995 | ........... G06F/17/50 |
| JP | 08274260 A | * | 10/1996 | ........... H01L/27/04 |
| JP | 9-269847 | | 10/1997 | |
| JP | 11-191019 | | 7/1999 | |
| JP | 11-232311 | | 8/1999 | |
| JP | 11232311 A | * | 8/1999 | ........... G06F/17/50 |

* cited by examiner

*Primary Examiner*—Lynne H. Browne
*Assistant Examiner*—Nitin C. Patel (57) ABSTRACT

An object of the present invention is to enable precise and easy adjustment of clock skew. A clock distribution circuit is designed and the placement and routing of the entire chip including the clock distribution circuit follows. Then the clock skew value is calculated and whether the calculated clock skew exceeds a target value is checked. When the clock skew exceeds the target value, the outputs of some driver elements are disconnected or connected to adjust the clock skew. The steps disconnecting or connecting the outputs of the drivers are repeated until the clock skew becomes equal to or smaller than the target value.

6 Claims, 7 Drawing Sheets

PLACEMENT AND ROUTING METHOD FOR OPTIMIZING CLOCK SKEW IN CLOCK DISTRIBUTION CIRCUIT

BACKGROUND OF THE INVENTION

1. Field of the Invention

The present invention relates to a placement and routing method for clock distribution circuits, a clock distribution circuit manufacturing method, a semiconductor device manufacturing method, a clock distribution circuit and a semiconductor device, and particularly to an improvement for precisely and easily adjusting the clock skew.

2. Description of the Background Art

In an LSI (Large-Scale Integrated Circuit), it is not easy to supply a clock at the same time to all sequential elements (e.g. flip-flops) included in the circuitry without causing time differences in arrival of the clock among the sequential elements receiving it. These time differences are called clock skew. Particularly, operating LSIs at high speed requires highly precise clock skew control in order to reduce the clock skew to a very small value.

Factors contributing to the clock skew include non-uniformity of positions of the sequential elements and non-uniformity of the interconnection capacitances due to differences in interconnection length among adjacent interconnections or differences in intersection ratio among interlayer interconnections. Therefore, in order to design a clock distribution circuit with a small clock skew, it is desirable to first conduct the placement and routing of the circuitry which is supplied with the clock (the circuitry is referred to as load circuit in this specification) and then design the clock distribution circuit. However, since the clock distribution circuit is distributed over the entire area of the semiconductor chip, there is a basic contradiction that the placement and routing cannot be finally settled until the clock distribution circuit has been designed.

Known conventional layout design methods for clock distribution circuit include the technique described in Japanese Patent Application Laid-Open No. 9-269847 (1997). In this conventional technique, two or more driver elements having different characteristics are placed in each of the positions of the driver elements in the clock distribution circuit and the clock skew is controlled by selecting one of the two or the more.

Figure 10:
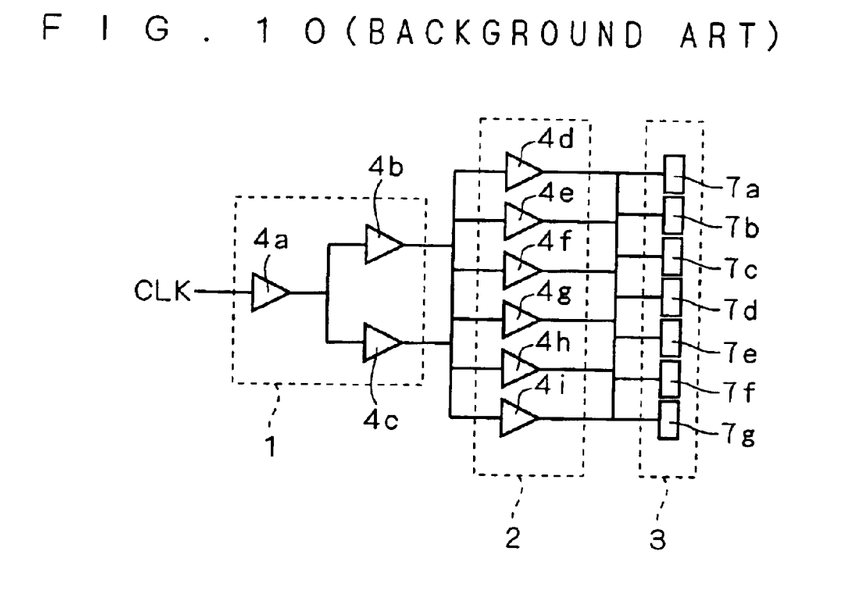
FIGS. 10 and 11 are diagrams used to explain a conventional placement and routing method.

FIG. 10 is a circuit diagram showing the structure of a clock distribution circuit before the clock skew has been adjusted by this conventional technique. In this clock distribution circuit, the input clock CLK is distributed through the predriver circuit 1 having cascade-connected driver elements 4a, 4b and 4c to the main driver circuit 2 having driver elements 4d to 4i. The main driver circuit 2 supplies the clock to the load circuit 3 having sequential elements 7a to 7g and clock interconnections connecting the main driver circuit 2 and the sequential elements 7a to 7g. The predriver circuit 1 in the first stage and the main driver circuit 2 in the final stage are cascade-connected.

Figure 11:
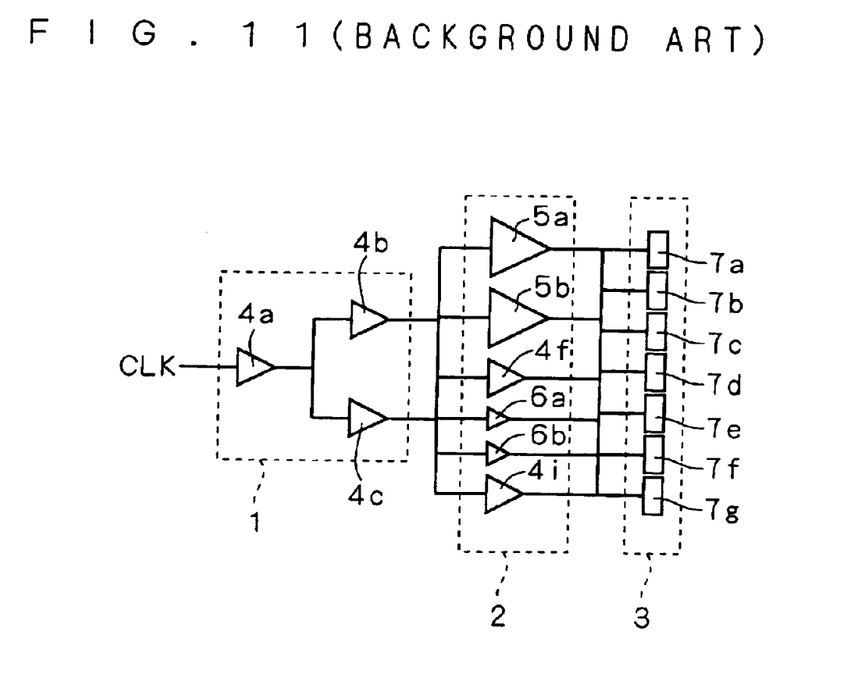

FIG. 11 is a circuit diagram showing the structure of the clock distribution circuit obtained after the clock skew adjustment. In the example shown in FIG. 11, in order to adjust the clock skew, the driver elements 4d and 4e belonging to the main driver circuit 2 have been replaced by driver elements 5a and 5b having a larger driving capability and a larger input capacitance and the driver elements 4g and 4h have been replaced by driver elements 6a and 6b having a smaller driving capability and a smaller input capacitance.

Figure 12:
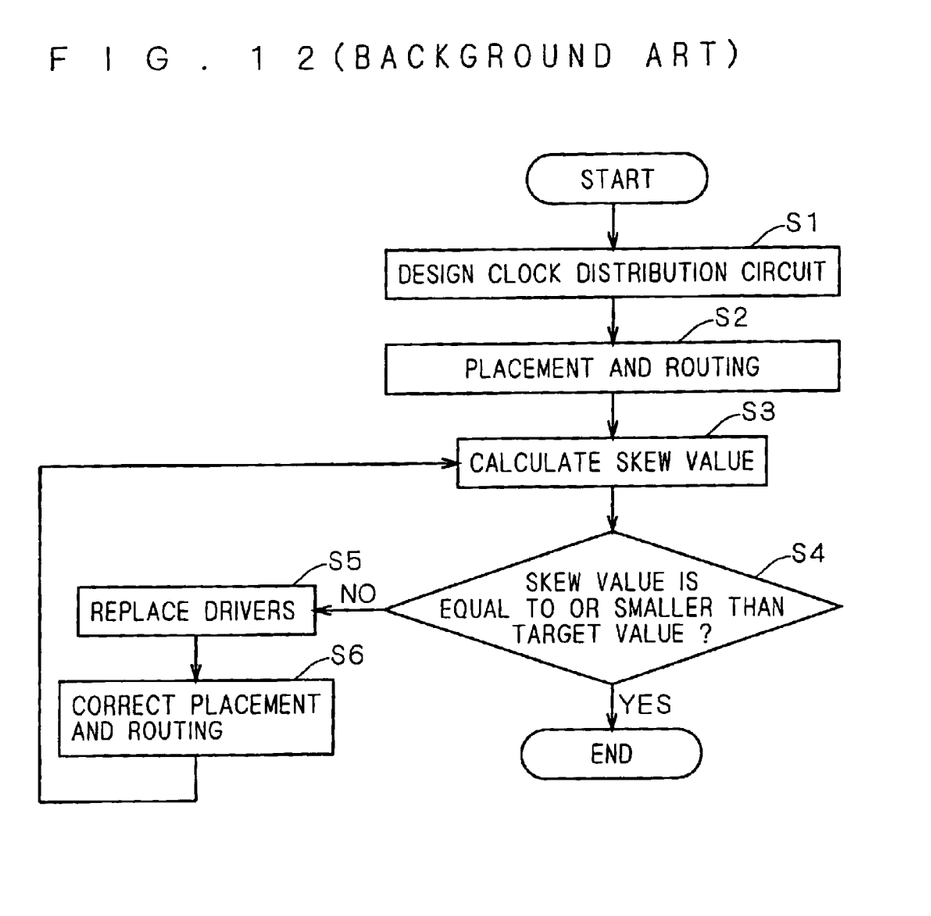
FIG. 12 is a flowchart showing the conventional placement and routing method.

FIG. 12 is a flowchart showing the procedure of placement and routing method for the above-described clock distribution circuit according to the conventional technique. In this method, the clock distribution circuit is designed first (S1) and the placement and routing of the entire chip including the clock distribution circuit follows (S2). In the step S2, the placement and routing of the clock distribution circuit is a temporary one. Next, the clock skew value is calculated (S3) and then whether the calculated clock skew exceeds a target value is checked (S4).

If the step S4 decides that the clock skew exceeds the target value, some of the driver elements are replaced with other driver elements having different driving capabilities and different input capacitances to adjust the clock skew (S5). Then the placement and routing is corrected as required by the replacement of the driver elements (S6) and then whether the clock skew exceeds the target value is checked again (S3, S4). The process ends if the step S4 shows that the clock skew has become equal to or smaller than the target value. In this way, the conventional technique adjusts the clock skew through replacements between driver elements having different driving capabilities and different input capacitances.

In the conventional technique, since a driver element is replaced by another driver element having a different input capacitance, the circuit characteristic varies seen from the preceding circuit. As a result, the replacement of the driver elements may require correction of the preceding circuit. Furthermore, the driver elements are generally exchanged between elements having their input pins and output pins laid out in different positions, so that replacing the driver elements requires correction of the interconnections. Thus, the placement and routing may have to be largely corrected every time a driver element is replaced, which increases the time required for the design. Moreover, correcting the placement and routing changes factors contributing to the clock skew, which makes it difficult to precisely adjust the clock skew.

SUMMARY OF THE INVENTION

The present invention has been made to solve the above-described problems of the conventional technique, and an object of the present invention is to obtain a placement and routing method for a clock distribution circuit, a clock distribution circuit manufacturing method, a semiconductor device manufacturing method, a clock distribution circuit and a semiconductor device which allow the clock skew to be adjusted highly precisely and easily.

A first aspect of the present invention is directed to a placement and routing method for a clock distribution circuit which receives a clock and supplies the clock to a load circuit. According to the first aspect, the method comprises the steps of: (a) temporarily placing and routing a group of elements having a common input capacitance to form the clock distribution circuit; and (b) until an evaluated value of clock skew becomes equal to or smaller than a target value, making a selective replacement of an element belonging to the group of elements among a plurality of elements having a common input capacitance and selected from a group consisting of a plurality of driver elements having different driving capabilities, a driver element having an opened output pin and a capacitance element interposed between an input pin and a stable potential line.

Preferably, according to a second aspect, in the placement and routing method for a clock distribution circuit, the step (b) makes the selective replacement of an element belonging to the group of elements between a first driver element and a second driver element identical to the first driver element and having an opened output pin until the evaluated value of clock skew becomes equal to or smaller than the target value.

Preferably, according to a third aspect, in the placement and routing method for a clock distribution circuit, the step (b) makes the selective replacement of an element belonging to the element group between a driver element and a capacitance element sharing a common input capacitance with the driver element and interposed between an input pin and a stable potential line until the evaluated value of clock skew becomes equal to or smaller than the target value.

Preferably, according to a fourth aspect, in the placement and routing method for a clock distribution circuit, the step (b) makes the selective replacement of an element belonging to the element group among a plurality of driver elements having different driving capabilities and a common input capacitance and having their input pins placed in equivalent positions and their output pins placed in equivalent positions until the evaluated value of clock skew becomes equal to or smaller than the target value.

A fifth aspect is directed to a placement and routing method for a clock distribution circuit which receives a clock and supplies the clock to a load circuit. According to the fifth aspect, the method comprises the steps of: (a) temporarily placing and routing a group of driver elements having their input pins placed in equivalent positions and their output pins placed in equivalent positions to form the clock distribution circuit; and (b) until an evaluated value of clock skew becomes equal to or smaller than a target value, making a selective replacement of a driver element belonging to the group of driver elements among a plurality of driver elements having different driving capabilities and having their input pins placed in equivalent positions and output pins placed in equivalent positions.

A sixth aspect is directed to a method of manufacturing a clock distribution circuit which receives a clock and supplies the clock to a load circuit. According to the sixth aspect, the clock distribution circuit manufacturing method comprises the steps of: (A) performing a placement and routing of the clock distribution circuit comprising the steps of (A-1) temporarily placing and routing a group of elements having a common input capacitance to form the clock distribution circuit, and (A-2) until an evaluated value of clock skew becomes equal to or smaller than a target value, making a selective replacement of an element belonging to the group of elements among a plurality of elements having a common input capacitance and selected from a group consisting of a plurality of driver elements having different driving capabilities, a driver element having an opened output pin and a capacitance element interposed between an input pin and a stable potential line; and (B) fabricating the clock distribution circuit obtained through the step of placement and routing in a semiconductor substrate.

Also, a method of manufacturing a clock distribution circuit which receives a clock and supplies the clock to a load circuit comprises the steps of: (A) performing a placement and routing of the clock distribution circuit comprising the steps of (A-1) temporarily placing and routing a group of driver elements having their input pins placed in equivalent positions and their output pins placed in equivalent positions to form the clock distribution circuit, and (A-2) until an evaluated value of clock skew becomes equal to or smaller than a target value, making a selective replacement of a driver element belonging to the group of driver elements among a plurality of driver elements having different driving capabilities and having their input pins placed in equivalent positions and their output pins placed in equivalent positions; and (B) fabricating the clock distribution circuit obtained through the step of placement and routing in a semiconductor substrate.

According to a seventh aspect, a method of manufacturing a semiconductor device comprises the steps of: (A) performing a placement and routing of a clock distribution circuit which receives a clock and supplies the clock to a load circuit comprising the steps of (A-1) temporarily placing and routing a group of elements having a common input capacitance to form the clock distribution circuit, and (A-2) until an evaluated value of clock skew becomes equal to or smaller than a target value, making a selective replacement of an element belonging to the group of elements among a plurality of elements having a common input capacitance and selected from a group consisting of a plurality of driver elements having different driving capabilities, a driver element having an opened output pin and a capacitance element interposed between an input pin and a stable potential line; and (B) fabricating, in a semiconductor substrate, the clock distribution circuit obtained through the step of placement and routing and the load circuit which is supplied with the clock from the clock distribution circuit.

Also, a method of manufacturing a semiconductor device comprises the steps of: (A) performing a placement and routing of a clock distribution circuit which receives a clock and supplies the clock to a load circuit comprising the steps of (A-1) temporarily placing and routing a group of driver elements having their input pins placed in equivalent positions and their output pins placed in equivalent positions to form the clock distribution circuit, and (A-2) until an evaluated value of clock skew becomes equal to or smaller than a target value, making a selective replacement of a driver element belonging to the group of driver elements among a plurality of driver elements having different driving capabilities and having their input pins placed in equivalent positions and their output pins placed in equivalent positions; and (B) fabricating, in a semiconductor substrate, the clock distribution circuit obtained through the step of placement and routing and the load circuit which is supplied with the clock from the clock distribution circuit.

According to an eighth aspect, a clock distribution circuit which receives a clock and supplies the clock to a load circuit comprises a plurality of elements having a common input capacitance and selected from a group consisting of a plurality of driver elements having different driving capabilities, a driver element having an opened output pin and a capacitance element interposed between an input pin and a stable potential line.

Preferably, according to a ninth aspect, in the clock distribution circuit, the plurality of elements comprise a first driver element and a second driver element identical to the first driver element and having an opened output pin.

Preferably, according to a tenth aspect, in the clock distribution circuit, the plurality of elements comprise a driver element and a capacitance element sharing a common input capacitance with said driver element and interposed between an input pin and a stable potential line.

Preferably, according to an eleventh aspect, in the clock distribution circuit, the plurality of elements comprise a plurality of driver elements having different driving capabilities and a common input capacitance and having their input pins placed in equivalent positions and their output pins placed in equivalent positions.

According to a twelfth aspect, a clock distribution circuit which receives a clock and supplies the clock to a load circuit comprises a plurality of driver elements having different driving capabilities and having their input pins placed in equivalent positions and their output pins placed in equivalent positions.

According to a thirteenth aspect, a semiconductor device comprises: (A) a clock distribution circuit which receives a clock, the clock distribution circuit comprising a plurality of elements having a common input capacitance and selected from a group consisting of a plurality of driver elements having different driving capabilities, a driver element having an opened output pin, and a capacitance element interposed between an input pin and a stable potential line; and (B) a load circuit which is supplied with the clock from the clock distribution circuit.

Also, a semiconductor device comprises: (A) a clock distribution circuit which receives a clock, the clock distribution circuit comprising a plurality of driver elements having different driving capabilities and having their input pins placed in equivalent positions and their output pins placed in equivalent positions; and (B) a load circuit which is supplied with the clock from the clock distribution circuit.

According to the method of the first aspect, the clock skew is adjusted through a replacement among elements having different driving capabilities and a common input capacitance. Accordingly the replacement of elements does not affect the preceding circuit and the clock skew can be adjusted easily and precisely.

According to the method of the second aspect, the clock skew is adjusted through a replacement between a first driver element and a second driver element identical to the first driver element and having an opened output pin, in other words, by selectively disconnecting or connecting the interconnection connected to the output pin of the driver element. Accordingly there is little need to change the placement and routing and the clock skew can be adjusted easily in a short time.

According to the method of the third aspect, the clock skew is adjusted through a replacement between a driver element and a capacitance element having a common input capacitance. Accordingly there is little need to change the placement and routing and the clock skew can be easily adjusted in a short time. Furthermore, using a capacitance element free from short-circuit current as an element not contributing to the transfer of clock reduces the current dissipation.

According to the method of the fourth aspect, the clock skew is adjusted through a replacement among a plurality of driver elements having different driving capabilities and a common input capacitance and having their input pins placed in equivalent positions and their output pins placed in equivalent positions. Accordingly there is little need for changing the placement and routing and the clock skew can be easily and more precisely adjusted in a shorter time. Further, this method can be applied to a wide range of clock distribution circuits including those of the clock tree type.

According to the method of the fifth aspect, the clock skew is adjusted through a replacement among a plurality of driver elements having different driving capabilities and having their input pins placed in equivalent positions and their output pins placed in equivalent positions. Accordingly there is little need for changing the placement and routing and the clock skew can be easily adjusted in a shorter time. Further, this method can be applied to a wide range of clock distribution circuits including those of the clock tree type.

According to the method of the sixth aspect, a clock distribution circuit is manufactured by fabricating a clock distribution circuit obtained through the placement and routing of the invention in a semiconductor substrate. A clock distribution circuit with precisely adjusted clock skew can thus be obtained.

According to the method of the seventh aspect, a semiconductor device is manufactured by fabricating, in a semiconductor substrate, a clock distribution circuit obtained through the placement and routing of the invention and a load circuit supplied with a clock from it. A semiconductor device with precisely adjusted clock skew can thus be obtained.

A plurality of elements having different driving capabilities and a common input capacitance are mixed in the device of the eighth aspect. This can realize precisely adjusted clock skew.

A first driver element and a second driver element identical to the first driver element and having an opened output pin are mixed in the device of the ninth aspect. This can realize precisely adjusted clock skew with a simple structure.

A driver element and a capacitance element having a common input capacitance are mixed in the device of the tenth aspect. This can realize precisely adjusted clock skew with a simple structure.

A plurality of driver elements having different driving capabilities and a common input capacitance and having their input pins placed in equivalent positions and their output pins placed in equivalent positions are mixed in the device of the eleventh aspect. This can realize more precisely adjusted clock skew.

A plurality of driver elements having different driving capabilities and having their input pins placed in equivalent positions and their output pins placed in equivalent positions are mixed in the device of the twelfth aspect. This can realize precisely adjusted clock skew.

The device of the thirteenth aspect has a clock distribution circuit of the invention and a load circuit which is supplied with a clock from it. This can realize a semiconductor device with precisely adjusted clock skew.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
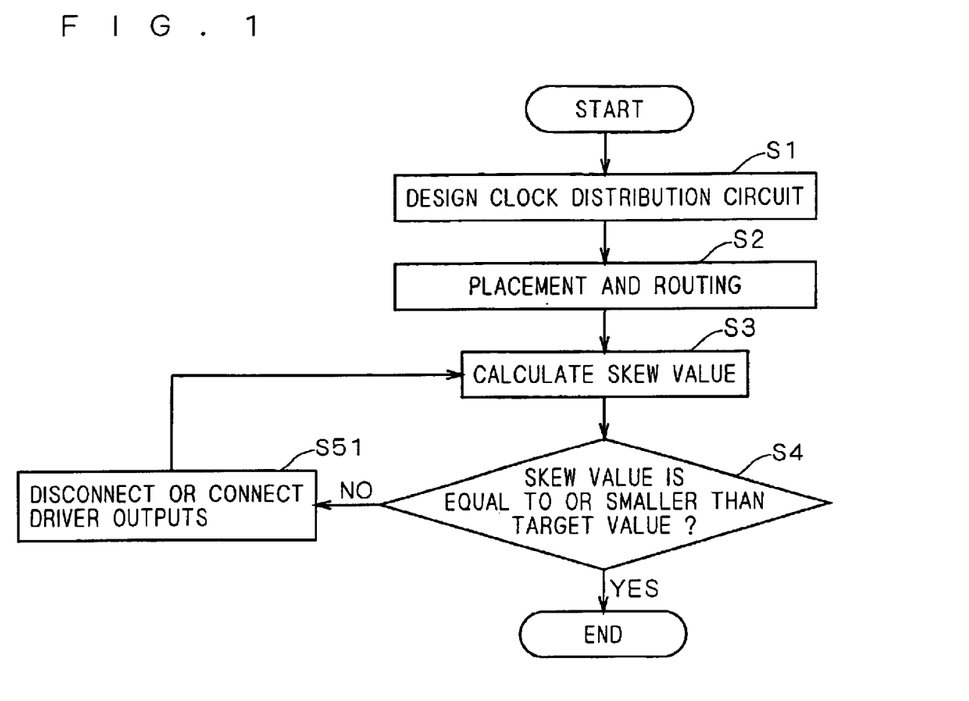
FIG. 1 is a flowchart showing a placement and routing method according to a first preferred embodiment.

FIG. 1 is a flowchart showing the procedure of a placement and routing method for clock distribution circuits according to a first preferred embodiment. In this method, the clock distribution circuit is designed first (S1) and the placement and routing of the entire chip including the clock distribution circuit follows (S2). In the step S2, the placement and routing of the clock distribution circuit is a temporary one. The clock distribution circuit in this stage is the same as that shown in FIG. 10, for example. In FIG. 10, the clock distribution circuit adopts the en bloc driving system and all driver elements belonging to the main driver circuit 2 have their outputs short-circuited.

Next, the clock skew value is calculated (i.e. evaluated; S3) and whether the calculated clock skew (i.e. evaluated value) exceeds a target value is checked (S4). When the step S4 decides that the clock skew exceeds the target value, then the outputs of some driver elements are selectively disconnected to adjust the clock skew (S51). More specifically, considering non-uniformity of elements in the load circuit, e.g. a storage device, or non-uniformity of the interconnection capacitances, etc., the outputs of driver elements having unnecessarily large driving capability are disconnected to remove unwanted driving capability in order to adjust the clock skew.

Figure 2:
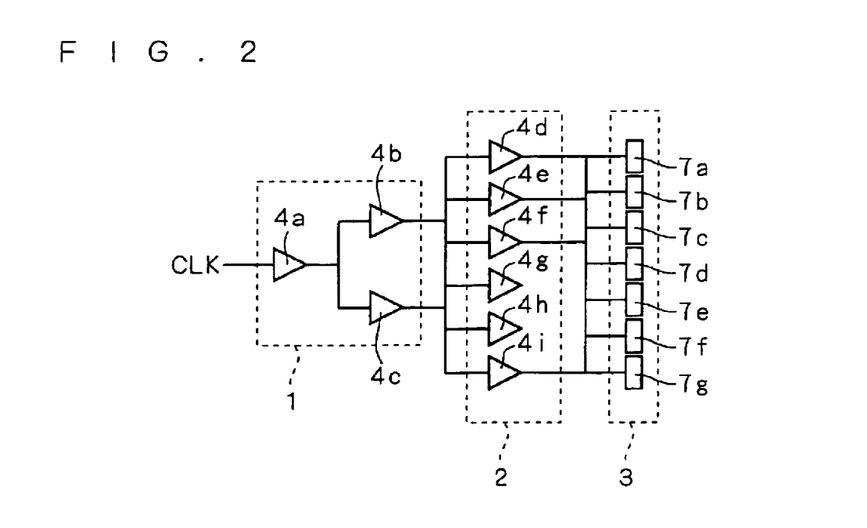
FIG. 2 is a diagram used to explain the placement and routing method of the first preferred embodiment.

Subsequently, it is checked again whether the clock skew exceeds the target value (S3, S4). The process ends when the step S4 shows that the clock skew has become equal to or smaller than the target value. FIG. 2 is a circuit diagram showing an example of the structure of the clock distribution circuit obtained as a result of this process. In FIG. 2, the outputs of the driver elements 4g and 4h belonging to the main driver circuit 2 are disconnected.

Referring to FIG. 1 again, the outputs of driver elements which were once disconnected may be connected again in the step S51. Further, in the step S2, a clock distribution circuit in which some of the driver elements are disconnected, e.g., the clock distribution circuit shown in FIG. 2, may be used in place of the clock distribution circuit of FIG. 10 as a clock distribution circuit obtained after the temporary placement and routing.

Disconnecting the output of a driver element is to remove or cut the interconnection connected to the output pin of the driver element. At the same time, this is equivalent to a replacement of the driver element with a driver element having the same structure and configuration but having an opened output pin. Thus, the process of the step S51 is equivalent to a replacement between driver elements and other driver elements having the same structure and configuration as those driver elements but having their output pins opened.

When the outputs of some driver elements get disconnected or connected, their input capacitance remains unchanged before and after the step S51. Therefore, when the driver elements whose outputs are disconnected or connected belong to the main driver circuit 2 of FIG. 2, for example, the input capacitance distribution of the main driver circuit 2 remains unchanged seen from the predriver circuit 1. Hence the process of the step S51 does not require changing a circuit, e.g. the predriver circuit 1, which precedes the driver elements processed in the step S51. In the example of FIG. 2, driver elements other than those belonging to the main driver circuit 2 may be processed in the step S51; the driver elements belonging to the predriver circuit 1 may be the targets for the processing.

Furthermore, there is little need to change the interconnections of the clock distribution circuit, since the step S51 just disconnects or connects driver elements, in other words, since it just makes a replacement between driver elements having connected output pins and identical driver elements having opened output pins.

As described above, the method of this preferred embodiment does not require changing the circuit which precedes the driver elements whose outputs have been disconnected or connected. Furthermore, there is little need to change the clock interconnections (i.e. the interconnections belonging to the clock distributions circuit). Accordingly, the placement and routing of the clock distribution circuit can be easily achieved in a shorter time. Moreover, placement and routing which will affect the clock skew is hardly changed, so that the clock skew can be adjusted very precisely through a reduced number of trials; that is to say, the clock skew can be adjusted in a shorter time by repeating the loop of the steps S3, S4 and S51 a smaller number of times.

As already stated about the conventional technique, it is originally desirable to perform the placement and routing of the load circuit before designing the clock distribution circuit. Accordingly the procedure shown by the flowchart of FIG. 3 may be used in place of the procedure shown in FIG. 1; in the flowchart of FIG. 3, the placement of the load circuit (S21) precedes the design of the clock distribution circuit (S1), and which is followed by the placement and routing of the clock distribution circuit and the routing of the load circuit (S22).

Figure 3:
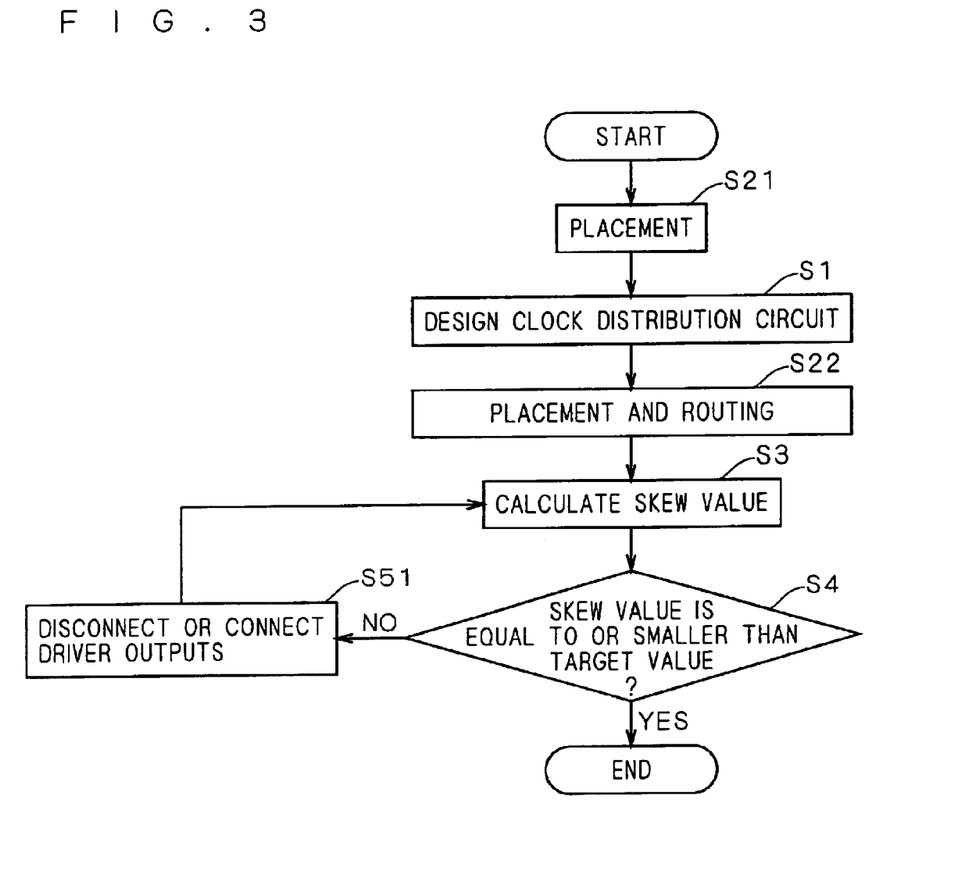
FIG. 3 is a flowchart showing another example of the placement and routing method of the first preferred embodiment.
Figure 4:
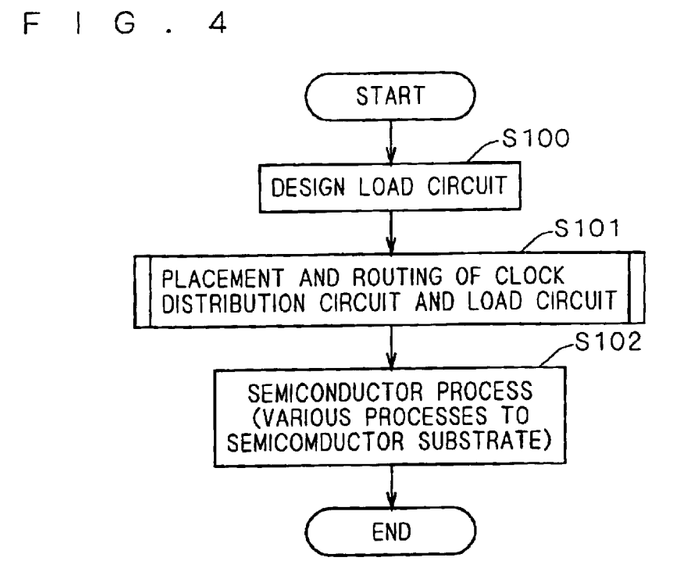
FIG. 4 is a flowchart showing a method for manufacturing a semiconductor device according to the first preferred embodiment.

The processing shown in FIG. 1 or FIG. 3 is conducted on a computer, and then a semiconductor process completes a semiconductor device as a product, reflecting the result of the processing of FIG. 1 or FIG. 3 on a semiconductor substrate. FIG. 4 is a flowchart showing the outline of this procedure. In manufacture of the semiconductor device, the load circuit is designed first (S100) and the process shown in FIG. 1 or FIG. 3 follows (S101). Next the semiconductor process is performed to apply various processings to the semiconductor substrate (S102).

In this semiconductor process, a clock distribution circuit obtained through the placement and routing by the process of FIG. 1 or FIG. 3 and a load circuit supplied with a clock from this clock distribution circuit are fabricated in a semiconductor substrate. A semiconductor device with precisely adjusted clock skew can thus be obtained. The semiconductor substrate is not limited to a bulk semiconductor substrate but it may be an SOI substrate, for example.

Second Preferred Embodiment

Figure 5:
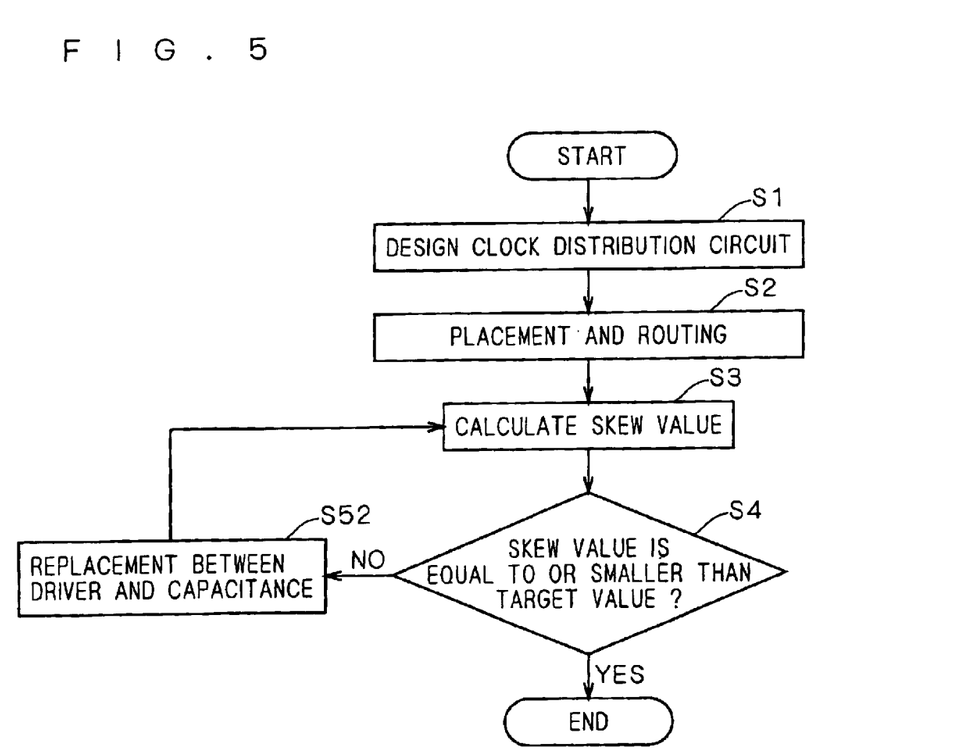
FIG. 5 is a flowchart showing a placement and routing method according to a second preferred embodiment.

FIG. 5 is a flowchart showing the procedure of a placement and routing method for clock distribution circuits according to a second preferred embodiment. This method characteristically differs from the method shown in FIG. 1 in that, when the step S4 decides that the clock skew exceeds the target value, some of the driver elements are replaced by capacitance elements having the same input capacitance as the driver elements to adjust the clock skew (S52).

Figure 6:
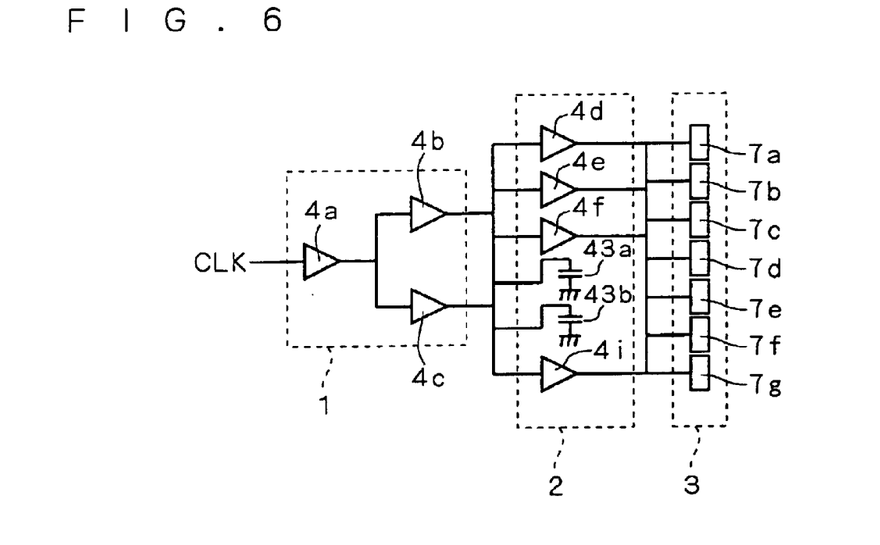
FIG. 6 is a diagram used to explain the placement and routing method of the second preferred embodiment.

FIG. 6 is a circuit diagram showing an example of the structure of a clock distribution circuit obtained as a result of the process of FIG. 5; in this example, the circuit shown in FIG. 10 is used as a clock distribution circuit obtained after the temporary placement and routing (S2). In FIG. 6, the two driver elements 4g and 4h belonging to the main driver circuit 2 have been replaced by capacitance elements 43a and 43b. The capacitance elements 43a and 43b substituted for the driver elements 4g and 4h are interposed between a stable potential line and the input pins which are used when driver elements are placed there. The stable potential line is an interconnection which holds a constant potential difference with respect to power-supply potential lines, or it may be a power-supply potential line itself; FIG. 6 shows a ground potential line, one of the power-supply potential lines, as an example.

In the step S52, a capacitance element once substituted may be replaced by a driver element again. Further, in the step S2, the clock distribution circuit obtained through the temporary placement and routing may be a clock distribution circuit in which some of the driver elements have been replaced by capacitance elements, e.g. the clock distribution circuit shown in FIG. 6, in place of the clock distribution circuit of FIG. 10. Accordingly, the step S52 can be generally represented as a process of making a selective replacement of elements belonging to the clock distribution circuit between driver elements and capacitance elements interposed between input pins and a stable potential line, the driver elements and capacitance elements having a common input capacitance.

As stated about the step S51 in the first preferred embodiment, the input capacitance of the exchanged elements remains unchanged before and after the step S52. Accordingly, when elements belonging to the main driver circuit 2 of FIG. 6 are replaced, for example, the input capacitance distribution of the main driver circuit 2 remains unchanged seen from the predriver circuit 1. Further, there is little need to change the interconnections of the clock distribution circuit since the step S52 only makes a replacement between driver elements and capacitance elements. In the example of FIG. 6, elements other than those belonging to the main driver circuit 2 may be replaced in the step S52; elements belonging to the predriver circuit 1 may be replaced.

Thus, according to the method of this preferred embodiment, there is no need to change the circuit which precedes the replaced elements, and there is little need to change the clock interconnections, so that the placement and routing of the clock distribution circuit can be easily achieved in a short time. Moreover, the placement and routing which will affect the clock skew is hardly changed, so that the clock skew can be adjusted very precisely with a reduced number of trials; that is, the number of repetitions of the loop of the steps S3, S4 and S52 can be reduced to shorten the time required for the adjustment of the clock skew. In addition, the capacitance elements, unlike the driver elements, are free from short-circuit current, and therefore the current dissipation can be reduced as compared with the clock distribution circuit of the first preferred embodiment.

Needless to say, the processes of the steps S1 and S2 of FIG. 5 can be replaced by the steps S21, S1 and S22 shown in FIG. 3 in the first preferred embodiment. Further, a semiconductor device having a clock distribution circuit reflecting the result of the process of FIG. 5 and a load circuit supplied with a clock from it can be manufactured by performing the process of FIG. 5 as the process of the step S101 shown in FIG. 4 in the first preferred embodiment.

Third Preferred Embodiment

Figure 7:
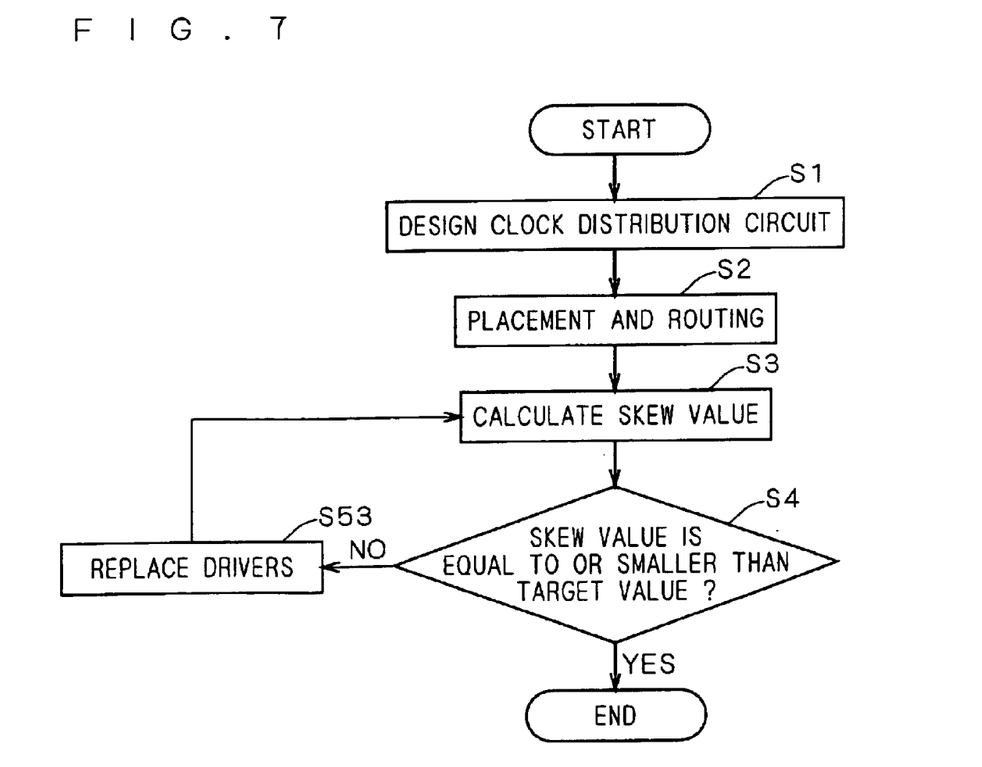
FIG. 7 is a flowchart showing a placement and routing method according to a third preferred embodiment.

FIG. 7 is a flowchart showing the procedure of a placement and routing method for clock distribution circuits according to a third preferred embodiment. This method characteristically differs from the method shown in FIG. 1 in that, when the step S4 decides that the clock skew exceeds the target value, some driver elements are replaced by other driver elements having different driving capabilities and having their input pins placed in equivalent layout positions and their output pins placed in equivalent layout positions, so as to adjust the clock skew (S53).

Figure 8:
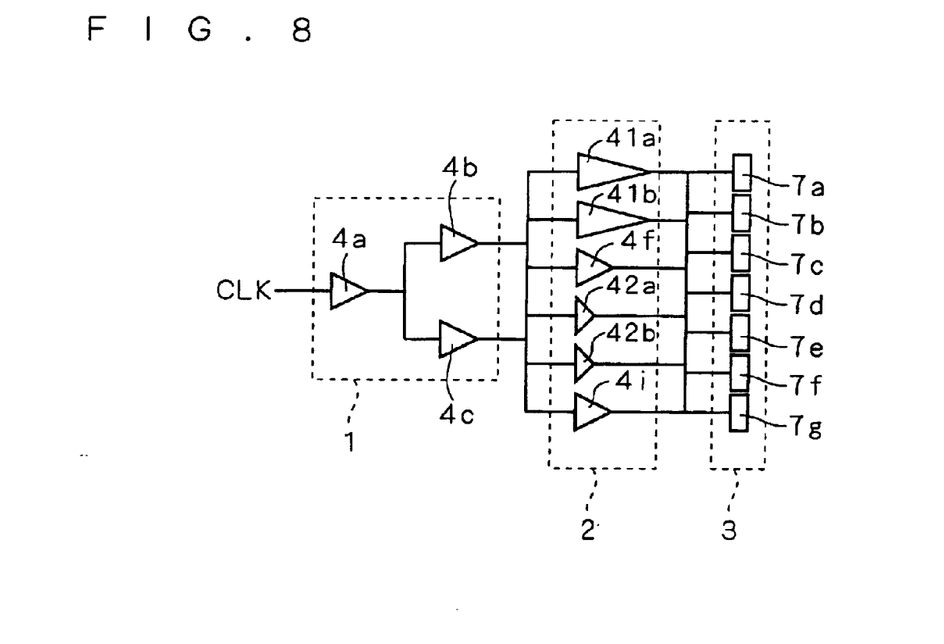
FIG. 8 is a diagram used to explain the placement and routing method of the third preferred embodiment.

FIG. 8 is a circuit diagram showing an example of the structure of a clock distribution circuit obtained as a result of the process of FIG. 7; the circuit shown in FIG. 10 is used as the clock distribution circuit obtained through the temporary placement and routing (S2). In FIG. 8, the two driver elements 4d and 4e belonging to the main driver circuit 2 have been replaced by other driver elements 41a and 41b having a higher driving capability and other two driver elements 4g and 4h have been replaced by other driver elements 42a and 42b having a lower driving capability.

In the step S53, a driver element once substituted may be replaced by the original driver element again. Further, in the step S2, the clock distribution circuit obtained after the temporary placement and routing may be a clock distribution circuit in which some of the driver elements have been replaced by other driver elements, e.g. the clock distribution circuit shown in FIG. 8, in place of the clock distribution circuit of FIG. 10. Thus, the step S53 can be generally represented as a step of making a selective replacement of elements belonging to the clock distribution circuit between a plurality of driver elements having different driving capabilities and a common input capacitance and having their input pins placed in equivalent positions and their output pins placed in equivalent positions.

As stated about the step S51 in the first preferred embodiment, the input capacitance of the exchanged elements remains unchanged before and after the step S53. Accordingly, when elements belonging to the main driver circuit 2 of FIG. 8 are replaced, for example, the input capacitance distribution of the main driver circuit 2 remains unchanged seen from the predriver circuit 1. Further, there is no need to change the interconnections of the clock distribution circuit since the step S53 only makes a replacement between driver elements between which input pins and output pins are laid out in common positions. In the example of FIG. 8, elements other than those belonging to the main driver circuit 2 may be replaced in the step S53; elements belonging to the predriver circuit 1 may be replaced.

As described above, the method of this preferred embodiment requires neither changing the circuit which precedes the replaced elements nor changing the clock interconnections, so that the placement and routing of the clock distribution circuit can be easily achieved in a short time. Moreover, placement and routing which will affect the clock skew is hardly changed, so that the clock skew can be adjusted very precisely with a reduced number of trials; that is, the number of repetitions of the loop of the steps S3, S4 and S53 can be reduced to shorten the time required for the adjustment of the clock skew.

Further, making a replacement between driver elements having various driving capabilities allows finer adjustment of the clock skew. That is, the clock skew can be adjusted more precisely.

Needless to say, the processes of the steps S1 and S2 of FIG. 7 can be replaced by the steps S21, S1 and S22 shown in FIG. 3 in the first preferred embodiment. Further, a semiconductor device having a clock distribution circuit reflecting the result of the process of FIG. 7 and a load circuit supplied with a clock from it can be manufactured by performing the process of FIG. 7 as the process of the step S101 shown in FIG. 4 in the first preferred embodiment.

Further, in the step S53, the selective replacement of elements belonging to the clock distribution circuit may be made between a plurality of driver elements having different driving capabilities and a common input capacitance. Specifically, the input and output pins may be laid out in different positions between driver element exchanged for each other. This still provides the advantage resulting from the fact that the exchanged driver elements have a common input capacitance.

Similarly, in the step S53, the selective replacement of elements belonging to the clock distribution circuit may be made between a plurality of driver elements having different driving capabilities and having their input pins placed in equivalent positions and their output pins placed in equivalent positions. That is to say, the input capacitance may differ between exchanged driver elements. This still provides the advantage resulting from the fact that the input pins and output pins are laid out in common positions between the exchanged driver elements.

Fourth Preferred Embodiment

Figure 9:
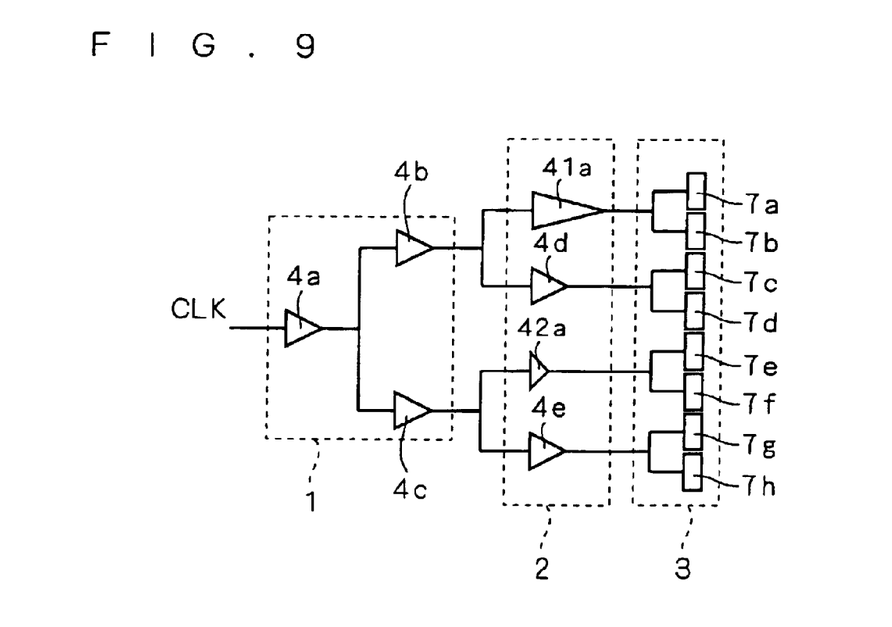
FIG. 9 is a diagram used to explain a placement and routing method according to a fourth preferred embodiment.

The method shown in FIG. 7 in the third preferred embodiment is applicable not only to clock distribution circuits based on the en bloc driving system as shown in FIGS. 10 and FIG. 8 but also to clock distribution circuits based on the clock-tree system. FIG. 9 is a circuit diagram showing an example of structure of a clock distribution circuit obtained after the process shown in FIG. 7; in the drawing, a clock distribution circuit based on the clock-tree system is adopted as the clock distribution circuit obtained through the temporary placement and routing of FIG. 7 (S2).

In the clock distribution circuit shown in FIG. 9, a plurality of driver elements are cascade-connected in tree form and the elements belonging to the load circuit 3 are arranged so that the driver elements belonging to the main driver circuit portion 2 are uniformly loaded. In the example of FIG. 9, as a result of the process of FIG. 7, one driver element in the main driver circuit 2 has been replaced by another driver element 41a having a higher driving capability and another driver element has been replaced by another driver element 42a having a lower driving capability.

Needless to say, also in applications to clock-tree type clock distribution circuits, the processes of the steps S1 and S2 of FIG. 7 can be replaced by the steps S21, S1 and S22 shown in FIG. 3 in the first preferred embodiment. Further, a semiconductor device having a clock-tree type clock distribution circuit reflecting the result of the process of FIG. 7 and a load circuit supplied with a clock from it can be manufactured by performing the process of FIG. 7 as the process of the step S101 shown in FIG. 4 in the first preferred embodiment.

Further, also in applications to clock-tree type clock distribution circuits, the step S53 can make a selective replacement of elements belonging to the clock distribution circuit between a plurality of driver elements having different driving capabilities and a common input capacitance, or between a plurality of driver elements having different driving capabilities and having input pins placed in equivalent positions and output pins placed in equivalent positions.

Modifications

The steps S51 to S53 in the first to fourth preferred embodiments may be simultaneously or selectively performed in the placement and routing of a single clock distribution circuit. Specifically, in general, while repeating the step S51 of FIG. 1 or FIG. 3, one of the steps S51 to S53 may be selectively performed in place of the step S51, or the steps S51 to S53 may be performed at the same time. Performing the steps at the same time means replacing a driver element with a capacitance element while replacing another driver element with a driver element having a higher driving capability, for example.

Such a process like a further generalized version of the steps S51 to S53 can be represented as a process of making a selective replacement of elements belonging to a clock distribution circuit between a plurality of elements having a common input capacitance and selected from the group consisting of a plurality of driver elements having different driving capabilities, driver elements having opened output pins, and capacitance elements interposed between input pins and a stable potential line. While such a general process is advantageous in that the selection can be made in a wide range, the methods of the first to fourth preferred embodiments are advantageous in that the processing is simpler and therefore the clock skew can be adjusted more easily in a shorter time.

While the invention has been described in detail, the foregoing description is in all aspects illustrative and not restrictive. It is understood that numerous other modifications and variations can be devised without departing from the scope of the invention.

What is claimed is:

1. A placement and routing method for a clock distribution circuit which receives a clock and supplies the clock to a load circuit, said method comprising:

(a) placing and routing a group of driver elements having a common input capacitance to form said clock distribution circuit;

(b) selectively replacing a first element belonging to said group of driver elements with a second element chosen from among a plurality of elements having the common input capacitance and differing from the first element with respect to (i) driving capability, (ii) having an opened output pin, or (iii) being a capacitance element interposed between an input pin and a stable potential line;

(c) repeating said selectively replacing said first element with said second element until an evaluated value of clock skew becomes equal to or smaller than a target value.

2. The placement and routing method for a clock distribution circuit according to claim 1, wherein said second element is identical to said first element but has said opened output pin.

3. The placement and routing method for a clock distribution circuit according to claim 1, wherein said second element is said capacitance element.

4. The placement and routing method for a clock distribution circuit according to claim 1, wherein said second element has a different driving capability than said first element and has input pin and output pin respectively placed in equivalent positions as said first element.

5. A placement and routing method for a clock distribution circuit which receives a cock and supplies the clock to a load circuit, said method comprising:

(a) placing and routing a group of driver elements having input pins and output pins respectively placed in equivalent positions as one another to form said clock distribution circuit;

(b) selectively replacing a first element belonging to said group of driver elements with a second element chosen from among a plurality of driver elements having a different driving capability than said first element and having input pins and output pins respectively placed in equivalent positions as said first element; and (c) repeating said selectively replacing said first element with said second element until an evaluated value of clock skew becomes equal to or smaller than a target value.

6. A method of manufacturing a clock distribution circuit which receives a clock and supplies the clock to a load circuit, said method comprising:

(A) placing and routing of said clock distribution circuit, said placing and routine including, (A-1) placing and routing a group of driver elements having a common input capacitance to form said clock distribution circuit, (A-2) selectively replacement a first element belonging to said group of driver elements with a second element chosen from among a plurality of elements having the common input capacitance and differing from the first element with respect to (i) driving capability, (ii) having an opened output pin, or (iii) being a capacitance element interposed between an input pin and a stable potential line; and (A-3) repeating said selectively replacing said first element with said second element until an evaluated value of clock skew becomes equal to or smaller than a target value, (B) fabricating said clock distribution circuit, obtained through said placing and routing, in a semiconductor substrate.

\* \* \* \* \*